United States Patent [19]

Mizuo

[11] Patent Number: 4,910,584

[45] Date of Patent: Mar. 20, 1990

[54] SEMICONDUCTOR DEVICE

[75] Inventor: Masahiko Mizuo, Funabashi, Japan

[73] Assignee: Fujitsu Limited, Kawasaki, Japan

[21] Appl. No.: 235,815

[22] Filed: Aug. 23, 1988

Related U.S. Application Data

[63] Continuation of Ser. No. 117,895, Oct. 30, 1987, abandoned, which is a continuation of Ser. No. 834,666, Feb. 28, 1986, abandoned, which is a continuation of Ser. No. 437,160, Oct. 27, 1982, abandoned.

[30] Foreign Application Priority Data

Oct. 30, 1981 [JP] Japan .................................. 56-173953

[51] Int. Cl.$^4$ ..................... H01L 23/36; H01L 23/06; H01L 23/14
[52] U.S. Cl. .......................................... 357/81; 357/74
[58] Field of Search ....................... 357/81, 74, 73, 75, 357/68, 80

[56] References Cited

U.S. PATENT DOCUMENTS

| | | | |
|---|---|---|---|
| 3,663,868 | 5/1972 | Noguchi et al. | 357/73 |
| 3,699,402 | 10/1972 | McCann et al. | 357/75 |
| 3,801,881 | 4/1974 | Anazawa | 357/74 |
| 3,972,062 | 7/1976 | Hopp | 357/74 |
| 4,025,997 | 5/1977 | Gernitis et al. | |
| 4,383,270 | 5/1983 | Schelhorn | 357/81 |
| 4,445,274 | 5/1984 | Suzuki et al. | 357/80 |
| 4,541,003 | 9/1985 | Otsuka et al. | 357/84 |

FOREIGN PATENT DOCUMENTS

| | | | |
|---|---|---|---|
| 0028802 | 5/1981 | European Pat. Off. | |
| 2181892 | 12/1973 | France | |
| 0105656 | 8/1981 | Japan | 357/81 |
| 2056772 | 3/1981 | United Kingdom | |

OTHER PUBLICATIONS

"Wrap Around Heat Sink"–Bond et al–IBM Technical Disclosure, pp. 1434–1435, Sep. 1977.
"Chip Heat Sink Package Assembly"–Johnson et al–IBM Tech. Disclosure–Mar. 1970, vol. 12, No. 10, p. 1665.

Primary Examiner—Rolf Hille
Assistant Examiner—S. V. Clark
Attorney, Agent, or Firm—Staas & Halsey

[57] ABSTRACT

A semiconductor device including a semiconductor chip, a leadless chip carrier to one side of which the chip is adhered, and a cap which seals the leadless chip carrier to protect the semiconductor chip. A heat sinking plate (21a or 21b) which is electrically connected to the semiconductor chip (8) is provided on the opposite side of the leadless chip carrier (1).

16 Claims, 4 Drawing Sheets

SEMICONDUCTOR DEVICE

This is a continuation of co-pending application Ser. No. 117,895 filed on 10/30/87, which is a continuation of U.S. Ser. No. 834,666, filed 2/28/86, now abandoned; which is a continuation of U.S. Ser. No. 437,160, filed 10/27/82, now abandoned.

BACKGROUND OF THE INVENTION

The present invention relates to a semiconductor device comprising a leadless chip carrier provided with a semiconductor chip thereon. In particular, it relates to an improvement of the structure of a chip carrier having a semiconductor memory chip thereon.

The increasingly larger scale of computer systems has brought along with it a sharp rise in the number of semiconductor elements, for example semiconductor memory elements, used per system. This would normally cause a drop in computing speed, due to the increased wiring length, and larger system external dimensions. As a means to prevent this, large amounts of packaged semiconductor memory elements have begun to be used in recent times.

FIG. 1A is a cross-sectional view of a conventionally packaged semiconductor memory element having leadless chip carrier.

FIG. 1B is a bottom view of FIG. 1A.

Referring to FIG. 1A, a ceramic substrate 1 is provided with a ceramic frame 2 through inner connections 4, of which the surface portion is plated with gold, etc. Outer connections 5, also plated with gold, etc. extend from the inner connections 4 and connect to terminals extending to the bottom surface of the ceramic substrate 1. A cap 8, made of, for example, metal, is connected to the ceramic frame 2 through cap-soldering metallized layer 7 and through a soldering material 9 of, for example, brazed alloy. In the recessed portion of the ceramic substrate 1, a semiconductor device, for example, a semiconductor memory chip 10, is provided through a gold/silicon layer 13 and through a chip stage 3 on which gold is plated. The semiconductor memory chip 10 is electrically connected to the inner connections through bonding pads 11 and through bonding wire 12. Thus, the semiconductor memory chip 10 is protected from mechanical impact and the harmful surrounding atmosphere.

Referring to FIG. 1B, the bottom of the ceramic substrate 1 is provided with a plurality of stripe shaped terminals 6, whose exposed surfaces are plated with gold, for electrical connection with the outer connections 5.

FIG. 2 is schematic cross-sectional view of the conventionally packaged semiconductor memory element shown in FIG. 1A and referred to here by the numeral 14 and a connection substrate 15.

The packaged semiconductor memory element 14 is defined as consisting of a cap 8, a semiconductor memory chip 10, ceramic substrate 1, which is a leadless chip carrier, and chip selecting terminals.

As shown in FIG. 2, the packaged semiconductor memory element 14 is mounted on a connection pattern 16 provided on the connection substrate 15 by soldering the terminals 6 on the bottom of the packaged semiconductor memory element 14 to the connection pattern 16. The soldered portion is illustrated by reference numeral 17 in FIG. 2. Thus, in the conventional structure of the packaged semiconductor memory element, the region wherein the semiconductor memory element contacts the connection substrate 15 is very small since the region is only the portion of the terminals 6 on the bottom of the packaged semiconductor memory element 14.

When the packaged semiconductor memory is working, the semiconductor memory chip 10 usually becomes heated. Some of this heat is conducted to the ceramic substrate 1. A small amount of the heat generated in the semiconductor memory chip 10, therefore, is conducted to the connection substrate 15 through the ceramic substrate 1. Most of the heat generated in the semiconductor memory chip 10, however, remains within the chip, though some heat is emitted from the surface of the semiconductor memory chip 10 to the surrounding atmosphere. Therefore, the semiconductor memory chip 10 is not sufficiently cooled or heat sunk.

The increased temperature of the semiconductor memory chip 10 raises the temperature of the surrounding atmosphere, further reducing the effect of cooling or heat sinking of the semiconductor memory chip 10. This results in an increased temperature of the packaged semiconductor memory element 14 and a reduced function thereof. This in turn makes it necessary to provide space between the semiconductor memory chips to increase the cooling or heat sinking effect, which blocks improvement of the element mounting or package density.

SUMMARY OF THE INVENTION

An object of the present invention is to provide a semiconductor device, for example, a semiconductor memory element wherein the semiconductor memory chip is more effectively cooled than in conventional types.

A second object of the present invention is to provide a semiconductor memory element with an improved package density.

A third object of the present invention is to provide a semiconductor memory device having a chip selecting terminal which acts as a heat sinking plate and is electrically connected to a semiconductor memory chip.

According to the present invention, there is provided a semiconductor device comprising:

a supporting member having first and second major surfaces which are formed parallel to each other, and side surfaces which are free from lead pins and have conductive patterns formed thereon;

a semiconductor chip mounted on the first surface of the supporting member;

a heat sinking plate attached to the second major surface of the supporting member and electrically connected to the semiconductor chip; and a cap which is placed on the supporting member to encapsulate the semiconductor chip.

BRIEF DESCRIPTION OF THE DRAWINGS

The present invention will now be explained by the following drawings, wherein.

DESCRIPTION OF THE PREFERRED EMBODIMENT

Figure 1A:
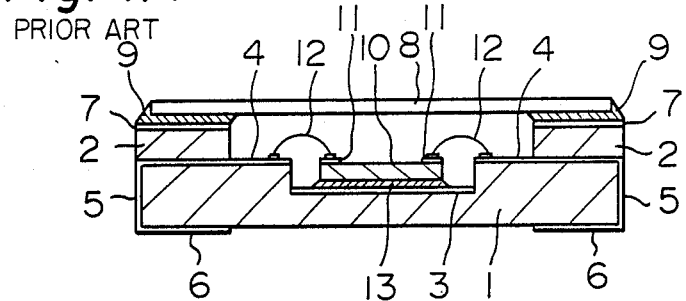
FIG. 1A is a cross-sectional view of a conventionally packaged semiconductor memory element having a leadless chip carrier.
Figure 1B:
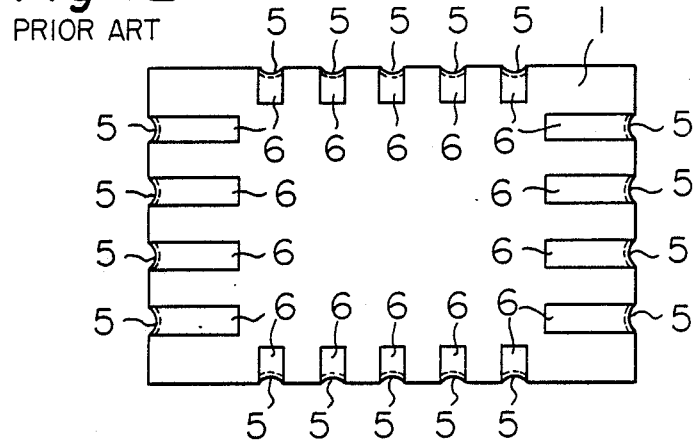
FIG. 1B is a bottom view of FIG. 1A.
Figure 2:
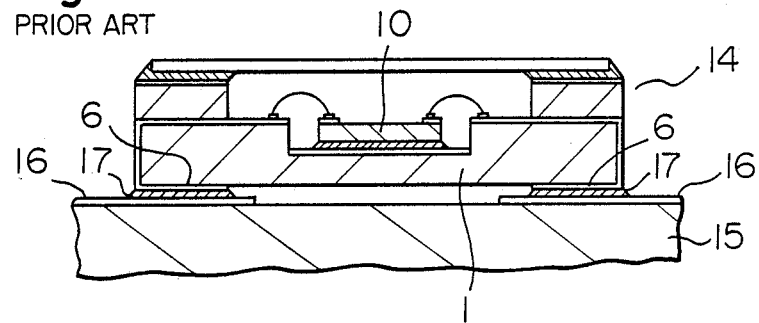
FIG. 2 is a cross-sectional view of the conventionally packaged semiconductor memory element of FIG. 1A and a connection substrate.
Figure 3A:
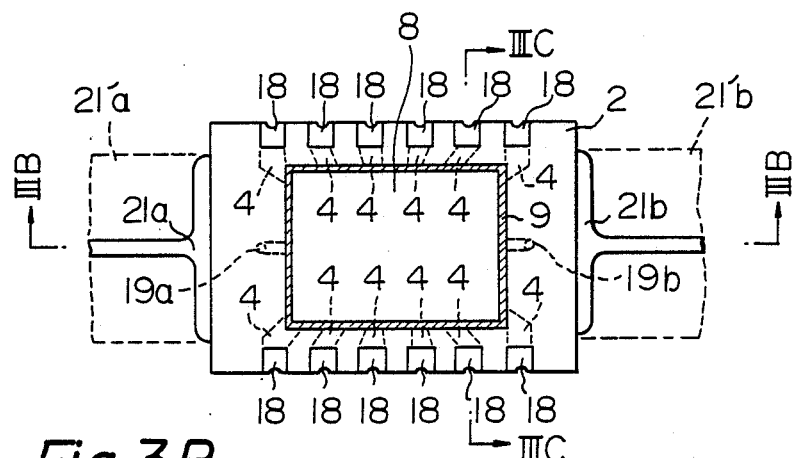
FIG. 3A is a top plan view of an embodiment according to the present invention.
Figure 3B:
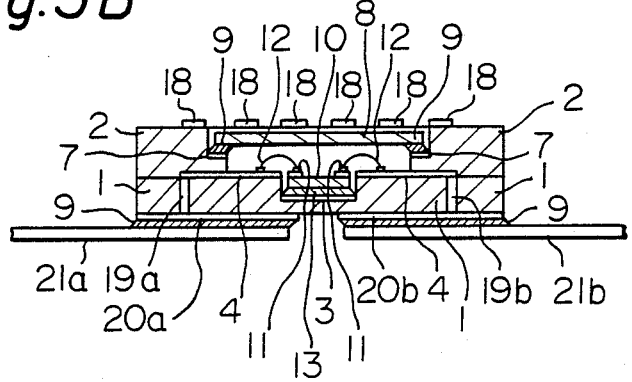
FIG. 3B is a cross-sectional view taken along IIIB—IIIB line of FIG. 3A.
Figure 3C:
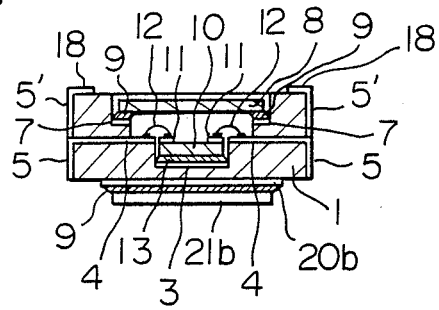
FIG. 3C is a cross-sectional view taken along IIIC—IIIC line of FIG. 3A.

In FIGS. 3A to 3C, a substrate 1, of ceramic or silicon carbide, is provided with a ceramic frame 2. The ceramic substrate 1 has a recess in which the semiconductor memory chip 10 is provided through chip stage 3 plated with, for example, gold. A desired bonding pad 11 of the semiconductor memory chip 10 is electrically connected to an exposed portion of the desired inner connections 4 with aluminum bonding wire 12 which is bonded to the bonding pad 11 provided on the surface of the semiconductor memory chip 10. The inner connections 4 are provided on the surface of the ceramic substrate 1. A cap 8, which seals the ceramic substrate 1 to protect the semiconductor memory chip 10, is adhered to the recess of the ceramic frame 2, which is formed in the inner side thereof, through a cap-soldering metallized layer 7 and soldering material 9 of, for example, a brazed alloy. The first outer connections 5, which are plated with, for example, gold, are led from the inner connections 4 to two parallel sides of the ceramic substrate 1. The second outer connections 5' which are also plated with, for example, gold, are formed on two parallel sides of the ceramic frame 2, the sides extending from the sides of the ceramic substrate 1. The first outer connections 5 are connected to the second outer connections 5' by using a brazed alloy. The second outer connections 5' extend to the upper surface of the ceramic frame 2 and form a terminal 18 for common connections such as input or output connections or power source connections. The terminal 18 is plated with, for example, gold. Two pads 20a and 20b are formed on the lower surface of the ceramic substrate 1. The pads 20a and 20b are connected to a desired inner connection 4 via through holes 19a and 19b formed in the ceramic substrate 1. Pads 20a and 20b have adhered to them chip selecting terminals 21a and 21b which have a high thermal conductivity and are connected to the pads with a solder material 9, such as a silver alloy, for receiving a chip selecting signal of a memory system.

Figure 3D:
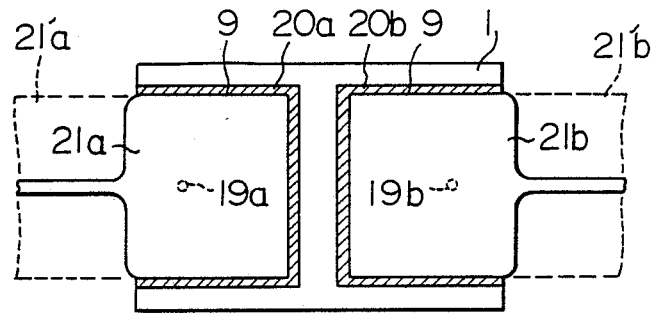
FIG. 3D is a bottom plan view of FIG. 3A.

The chip selecting terminals 21a and 21b are electrically connected to a semiconductor memory chip via through holes 19a and 19b. It is preferrable that the chip selecting terminals 21a and 21b be made of copper alloy or molybdenum and have a large area and a thickness of 0.3 to 0.5 mm. The ceramic frame 2 is formed so its upper surface is higher than the upper surface of the metal cap 8, so that when a conductor is mounted on the semiconductor memory element 14 (FIG. 4), the conductor does not touch the cap 8. Further, both top portions of the chip selecting terminals 21a and 21b are usually narrowed to a desired small width, as shown in FIGS. 3A and 3D, so that the chip selecting terminals 21a and 21b can easily be mounted on the connection substrate 15. However, if the situation permits, it is preferable that the top portions of the chip selecting terminals are not narrowed, as shown by the broken lines 21a' and 21b' in FIGS. 3A and 3D, because this shape is advantageous for effectiveness of the heat sink.

Figure 4:
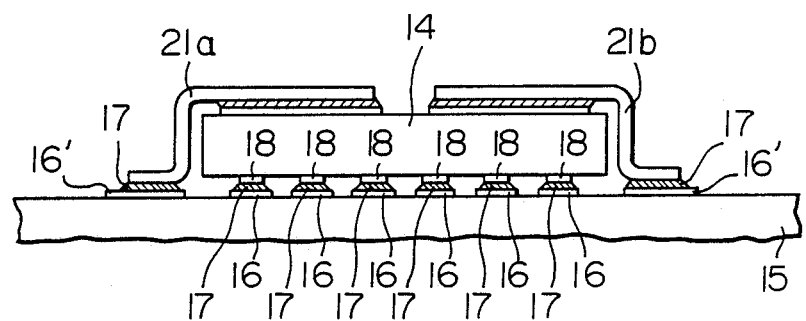
FIG. 4 is a cross-sectional view of the embodiment illustrated in FIGS. 3A to 3D horizontally mounted on a connection substrate.

In FIG. 4, a semiconductor memory element 14 is provided on a connection substrate 15 made of ceramic or plastic through terminals 18 for forming a common connection, solder 17, and connection patterns 16. Further, the chip selecting terminals 21a and 21b, which are soldered widely to the bottom of the semiconductor memory element 14 and are made of copper alloy, molybdenum, etc. having low thermal resistivity, are soldered to the connection substrate 15 through the connection pattern 16'.

Thus, as shown above, the semiconductor device according to the present invention comprises a conventional semiconductor memory element and chip selecting terminals which act as a heat sinking plate and are electrically connected to the semiconductor chip. According to the present invention, heat which is generated in the semiconductor memory chip (not shown in FIG. 4) during working thereof is conducted to the bottom surface of the semiconductor memory element 14 and then through the chip selecting terminals 21a and 21b to the connection substrate 15.

Since the connection area of the chip selecting terminals 21a and 21b to the bottom surface of the ceramic substrate 1 is broad, as shown in FIGS. 3A and 3D, part of the heat conducted to the chip selecting terminals 21a and 21b is radiated therefrom. Thus, the increase of temperature of the semiconductor chip can be kept to a lower level than in a conventional case. The semiconductor memory elements can therefore also be placed closer together, resulting in increased switching speed due to shorter connection lengths and increased package density.

Figure 5:
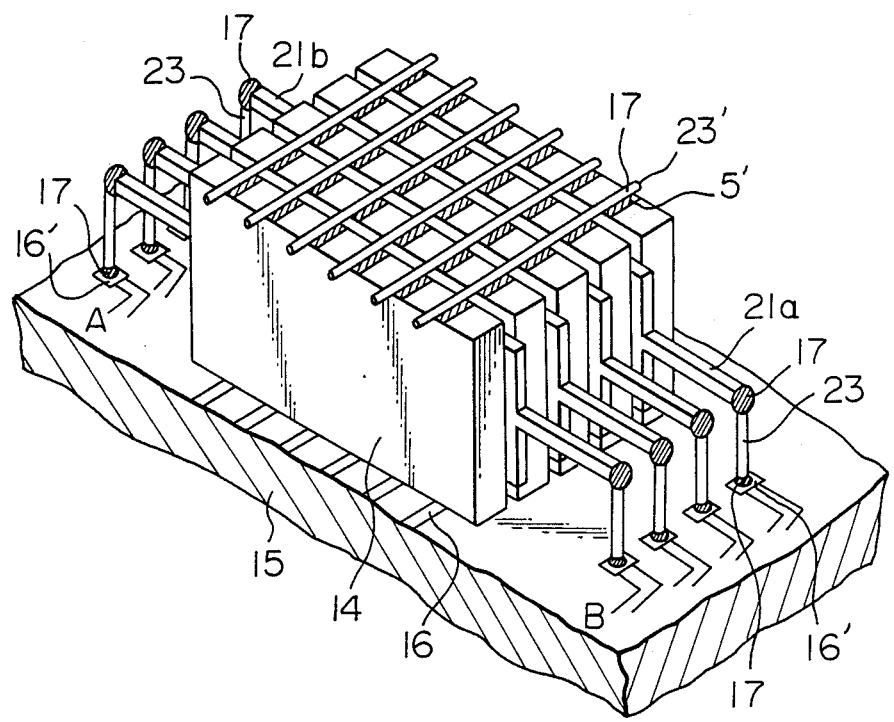
FIG. 5 is a perspective view illustrating another embodiment vertically mounted on a connection substrate.

Referring to FIG. 5, a block of vertically aligned semiconductor memory elements 14 is mounted on the connection substrate 15. In FIG. 5, the outer connections (not shown) for forming common connections provided on one side of each semiconductor memory element 14 are soldered to a common connection pattern 16 on the connection substrate 15. Each chip selecting terminal 21a and 21b is soldered to the chip selecting connection pattern 16' on the connection substrate 15 through a lead wire 23 having a diameter of 0.2 to 0.5 mm. Further, common connections comprising of a plurality of lead wires 23' having a diameter of 0.2 to 0.5 mm are soldered to the outer connections 5' for a common connection provided on the other side of each semiconductor memory element 14. One end of the lead wire 23' is connected to the power source (not shown) or input-or output terminal by a jack (not shown). Furthermore, sides A and B of the chip selecting connection pattern 16' are connected to a power source (not shown) and signal terminal.

In the mounting structure shown in FIG. 5, a heat sinking effect can be obtained, as mentioned above. Thus, such a mounting structure, wherein blocks of semiconductor memory elements are vertically provided on the connection substrate, enables significantly increased package density compared to a conventional mounting structure. Also, the length of the connection can be significantly shortened, thus, increasing the switching speed of the semiconductor device.

While there are shown and described preferred embodiments of the invention, it is to be distinctly understood that the invention is not limited thereto, but may be otherwise variously embodied and practiced within the scope of the following claims.

I claim:

1. A semiconductor device connected to a mother board, comprising:
   a supporting member having first and second major surfaces which are formed parallel to each other and having side surfaces which are free from lead pins, said supporting member having inner connections formed therein, and having a cavity formed in said first major surface;
   a semiconductor chip mounted in said cavity and connected to said inner connections;
   a cap, placed on said supporting member at said first major surface, for encapsulating said semiconductor chip and said cavity formed in said first major surface;
   a plurality of first connecting terminals provided on an outer portion of said first major surface of said supporting member and at the exterior of said cap and connected to said semiconductor chip through said inner connections;
   a pad provided on said second major surface of said supporting member, said pad substantially covering the second major surface, and connected to said semiconductor chip through said inner connections; and
   a heat sinking plate attached to substantially the entire surface of said pad and electrically connected to said semiconductor chip, the semiconductor device being connected to the mother board through said first connecting terminals and said heat sinking plate, said heat sinking plate having a first portion attached to said pad and a second portion extending from said first portion and connected to the mother board, said first portion having a larger width than said second portion.

2. A semiconductor device as claimed in claim 1, wherein said semiconductor chip is a semiconductor memory chip.

3. A semiconductor device as claimed in claim 1, wherein said cap comprises a material selected from the group consisting of metal, ceramic, and resin.

4. A semiconductor device as claimed in claim 1, werein said supporting member is made of ceramic or silicon carbide.

5. A semiconductor device as claimed in claim 1, operatively connectable to receive a chip selecting signal, wherein said heat sinking plate is used as a terminal for receiving the chip selecting signal.

6. A semiconductor device as claimed in claim 1 or 5, wherein said heat sinking plate has a has low thermal resistivity.

7. A semiconductor device as claimed in claim 1 or 5, wherein said heat sinking plate has a large surface area.

8. A semiconductor device as claimed in claim 1 or 5, wherein said heat sinking plate comprises copper alloy or molybdenum.

9. A semiconductor device as claimed in claim 1 or 5, wherein said supporting member has through holes for electrically connecting said heat sinking plate to said semiconductor chip.

10. A semiconductor device as claimed in claim 6, wherein said heat sinking plate has a large surface area.

11. A semiconductor device as claimed in claim 6, wherein said heat sinking plate comprises copper alloy or molybdenum.

12. A semiconductor device as claimed in claim 6, wherein said supporting member has through holes for electrically connecting said heat sinking plate to said semiconductor chip.

13. A semiconductor device as claimed in claim 7, wherein said heat sinking plate comprises copper alloy or molybdenum.

14. A semiconductor device as claimed in claim 7, wherein said supporting member has through holes for electrically connecting said heat sinking plate to said semiconductor chip.

15. A semiconductor device as claimed in claim 8, wherein said supporting member has through holes for electrically connecting said heat sinking plate to said semiconductor chip.

16. A semiconductor device connected to a mother board, comprising:
   a supporting member having first and second major surfaces which are formed parallel to each other, said first and second major surfaces having conductive patterns formed thereon, said first major surface having a cavity formed therein;
   inner connections formed in said supporting member;
   a semiconductor chip mounted in said cavity;
   a cap, connected to said supporting member, for encapsulating said semiconductor chip and said cavity at said first major surface;
   a plurality of first connecting terminals provided on an outer portion of said first major surface of said supporting member and the exterior of said cap and connected to said semiconductor chip through said inner connections;
   a pad provided on said second major surface of said supporting member, said second connecting terminal substantially covering said second major surface and connected to said semiconductor chip through said inner connections; and
   a heat sinking plate in heat exchange contact with said second major surface of said supporting member by substantially covering the entire surface of said pad, said semiconductor device being connected to the mother board through said first connecting terminals and said heat sinking plate, said heat sinking plate having a first portion attached to said pad and a second portion extending from said first portion and connected to the mother board, said first portion having a larger width than said second portion.

* * * * *

UNITED STATES PATENT AND TRADEMARK OFFICE
CERTIFICATE OF CORRECTION

PATENT NO. : 4,910,584
DATED : MARCH 20, 1990
INVENTOR(S) : MASAHIKO MIZUO

It is certified that error appears in the above-identified patent and that said Letters Patent is hereby corrected as shown below:

Col. 4, line 47, "comprising of a" should be --comprising a--.

Col. 5, line 22, "connections;" should be --connections and connected to the mother board;--;
       line 36, "board," should be --board providing an electrical connection to said mother board,--;
       line 45, "werein" should be --wherein--.

Col. 6, line 41, "connections;" should be --connections and connected to the mother board;--;
       line 43, "second connecting termi-" should be deleted;
       line 44, "nal" should be --pad--;
       line 53, "portion" should be --portion, having a first width,--;
       line 54, "portion" should be --portion, having a second width,--;
       line 55, "board," should be --board for providing an electrical connection,--;
       line 56, "portion having a" should be --width being--;
       line 57, "portion." should be --width.--.

Signed and Sealed this

Twenty-third Day of April, 1991

Attest:

HARRY F. MANBECK, JR.

Attesting Officer

Commissioner of Patents and Trademarks